APPARATUS FOR ASSEMBLING SEMICONDUCTOR DEVICE COMPONENTS

Original Filed July 8, 1965 7 Sheets-Sheet 1

INVENTORS:
ROBERT L. KOCH
EARL F. THOMAS
JOSEPH MIKLOS
BY WILLIAM CURRY

ATTORNEYS.

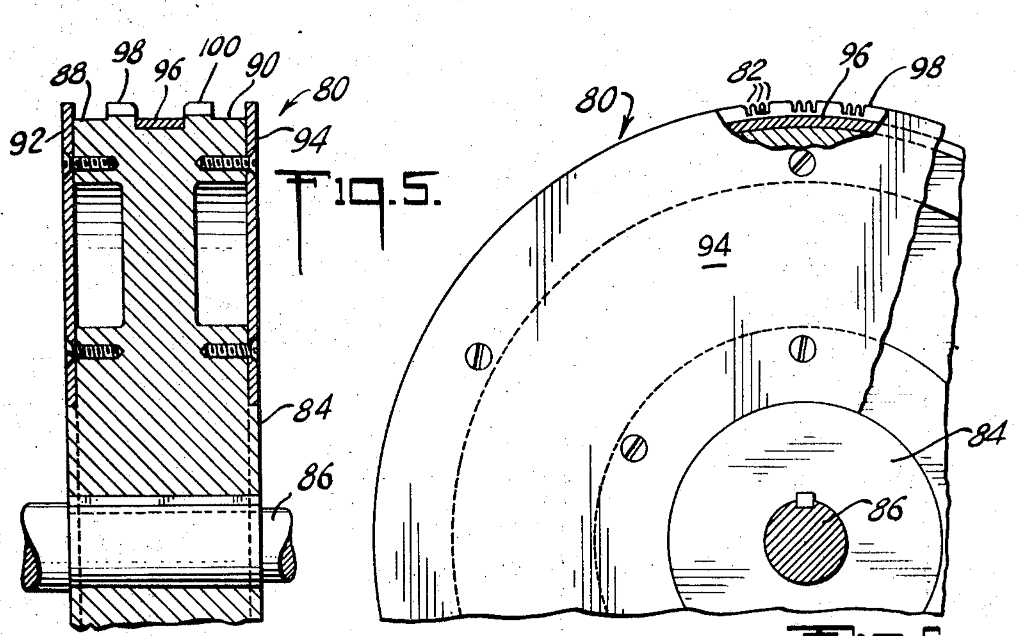
FIG. 5, FIG. 6
FIG. 6
FIG. 7
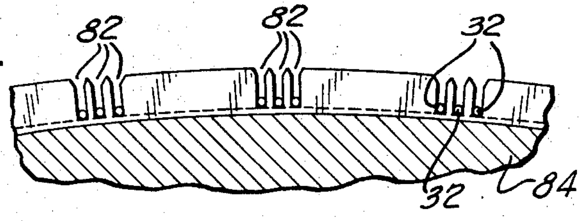
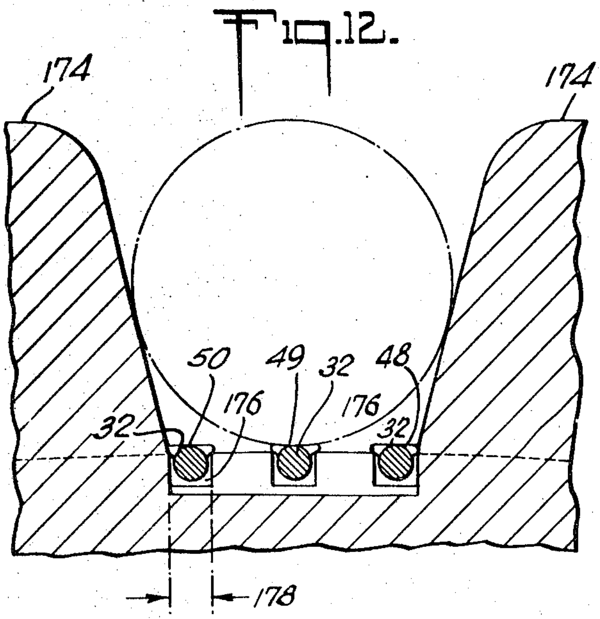
FIG. 12
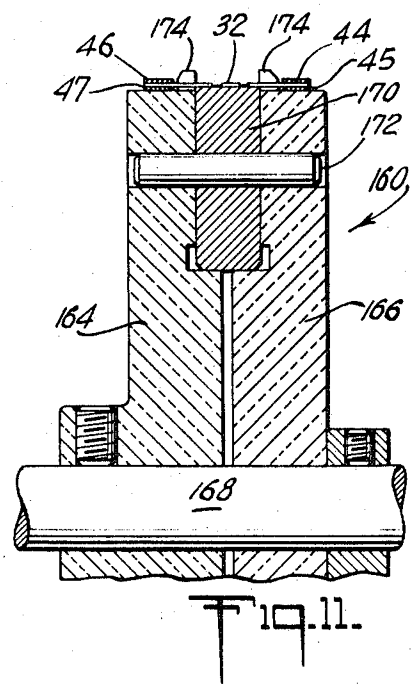
FIG. 11

Jan. 26, 1971 R. L. KOCH ET AL 3,557,431

APPARATUS FOR ASSEMBLING SEMICONDUCTOR DEVICE COMPONENTS

Original Filed July 8, 1965 7 Sheets-Sheet 4

United States Patent Office 3,557,431
Patented Jan. 26, 1971

3,557,431

APPARATUS FOR ASSEMBLING SEMICONDUCTOR DEVICE COMPONENTS

Robert L. Koch, Easton, Earl F. Thomas, Shelton, Joseph A. Miklos, Danbury, and William H. Curry, Bethel, Conn., assignors to National Semiconductor Corporation, Danbury, Conn.

Original application July 8, 1965, Ser. No. 470,410, now Patent No. 3,426,423, dated Feb. 11, 1969. Divided and this application Oct. 31, 1968, Ser. No. 810,050
Int. Cl. H05k *13/00*
U.S. Cl. 29—203 8 Claims

ABSTRACT OF THE DISCLOSURE

Apparatus for manufacturing plastic encapsulated transistors wherein the lead wires for a plurality of transistors are mounted in spaced relationship on strips of flexible carrier tape for transport to processing stations which may include those provided to flatten portions of the leads, mount a semiconductor body on one of the leads, interconnect electrodes of the semiconductor body to other leads and mold an encapsulating plastic body onto each transistor device.

This application is a division of my copending application Ser. No. 470,410, filed July 8, 1965, now U.S. Letters Patent 3,426,423 granted on Feb. 11, 1969.

This invention relates to apparatus for manufacturing electrical semiconductor devices with maximum speed and efficiency, and with minimum expense; more particularly, the present invention relates to apparatus for the semi-automated mass-production of relatively inexpensive semiconductor devices such as plastic-encapsulated transistors.

A problem which long has plagued the semiconductor manufacturing industry is that a relatively large amount of skilled hand-labor is required to assemble semiconductor devices. Other problems are created by the fact that each device almost invariably is assembled by a number of different workers performing different tasks on different machines at different stations. This tends to increase the labor cost of the devices since the workers usually must transport them between the machines, and must load and position the devices in each machine one-by-one. Although various systems have been suggested for solving some of these problems, they do not truly solve the problems and generally are quite expensive. Furthermore, they do not provide maximum utilization of each individual machine in the system.

In view of the foregoing, it is a major object of the present invention to provide semiconductor manufacturing equipment which greatly increase the efficiency and speed with which skilled assembly workers can perform their tasks, and to minimize the routine, relatively unskilled and time-consuming tasks require of such workers.

Further, it is an object of this invention to provide fabrication equipment which give maximum utilization of equipment and therefore minimize the cost of equipment required for the manufacturing system. It is a further object of the present invention to provide unique and relatively inexpensive equipment for manufacturing transistors which do not have metallic "headers" and have, instead, less expensive molded plastic bodies.

The drawings and description that follow describe the invention and indicate some of the ways in which it can be used. In addition, some of the advantages provided by the invention will be pointed out.

In the drawings:

FIG. 5 is a partially broken-away cross-sectional view taken along line 5—5 of FIG. 2;

FIG. 6 is a partially broken-away side elevation view of the structure shown in FIG. 5;

FIG. 7 is an enlarged view of a portion of the structure shown in FIG. 6;

FIG. 11 is a partially broken-away cross-sectional view taken along section line 11 of FIG. 8;

FIG. 12 is an enlarged view of a portion of the structure shown in FIG. 10;

MANUFACTURING METHOD AND SYSTEM

Figure 1:
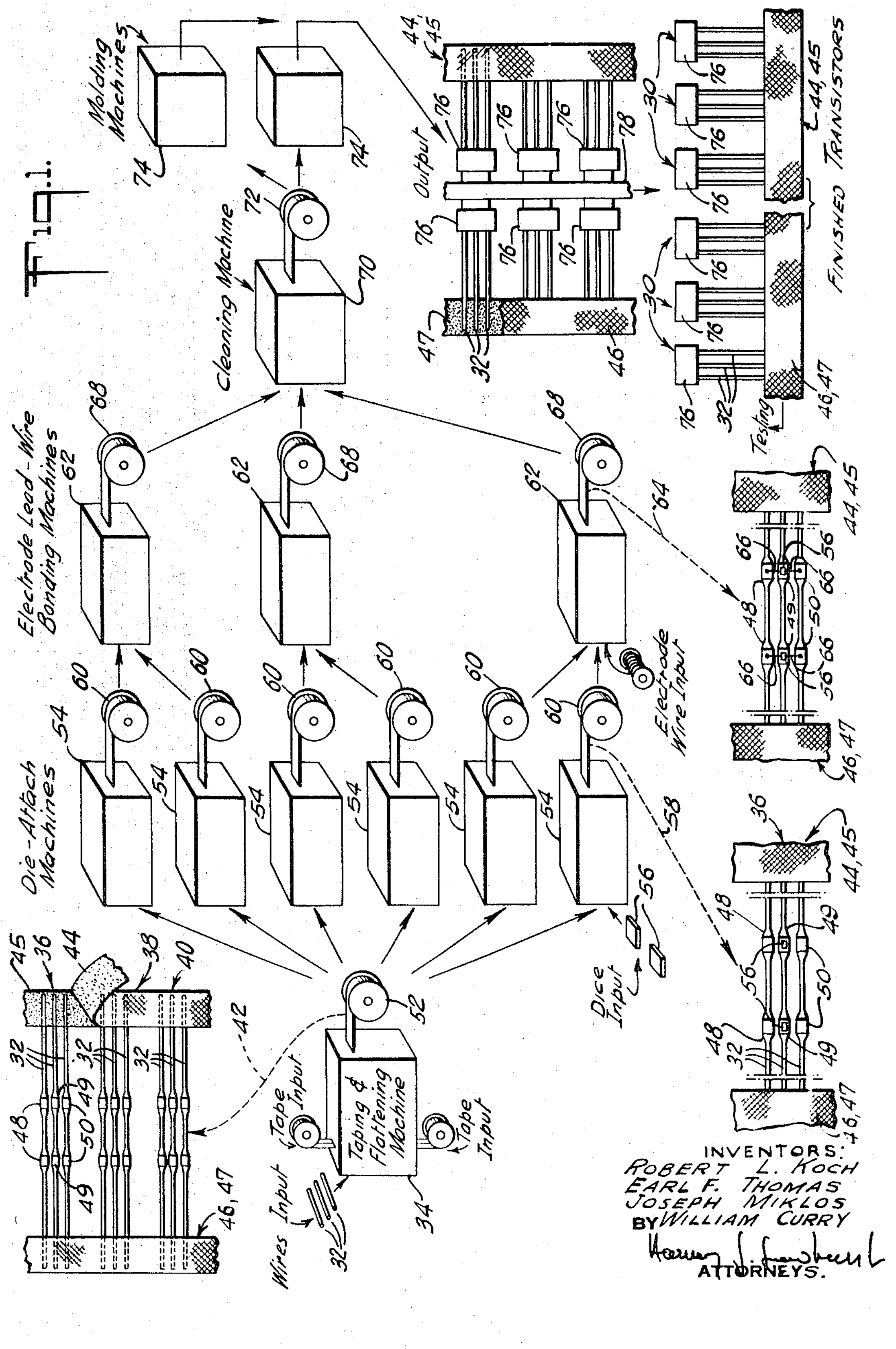
FIG. 1 is a partially schematic view illustrating the novel semiconductor manufacturing method and system of the present invention, and also illustrating a typical transistor product of the invention at various stages of its manufacture.

The preferred embodiment of the semiconductor manufacturing method and system of the present invention is illustrated in FIG. 1. In the lower right-hand corner of FIG. 1 are shown several "molded" transistors 30 produced by the method and system illustrated in FIG. 1. The molded transistors 30 are but one example of a variety of semiconductor devices which can be manufactured in accordance with the present invention.

As is shown in the left-hand portion of FIG. 1, electrical lead wires 32 are fed into a taping and flattening machine 34 which arranges the wires into parallel groups such as groups 36, 38 and 40, each of which includes three parallel wires 32. The taping machine then tapes the wires together at their ends and forms flattened areas for supporting semiconductor dice and electrode connections. The structure indicated by the dashed arrow 42 is a portion of the completed product of the taping machine 34.

Now explaining the taping and flattening process in greater detail, after the lead wires have been arranged in groups 36, 38 and 40, four straps 44, 45, 46 and 47 of pressure-sensitive adhesive tape are applied to the ends of the wires 32 to secure them together and form a highly convenient and advantageous conveyor belt of which the lead wires themselves are a structural component.

Each lead wire 32 referably is made of a ferrous metal such as that sold under the trademark "Kovar," with a thin plated gold coating on its exterior surface. Each of the adhesive tape strips 44–47 preferably is composed of a backing material of non-conducting flexible fabric such as fiber glass with a pressure-sensitive adhesive coating on one surface. Any desirerd flexible fabric may be used as a backing for the tape; however, the backing material preferably is pliable, is a relatively poor conductor of heat and electrical energy, and does not greatly expand or contract with wide temperature variations. Also, the material should not readily absorb moisture, and should not deform or deteriorate when subjected to moderately high temperatures. A woven cloth made of fiber glass meets these requirements admirably. However, other woven cloths and solid substances such as organic plastics are suitable for use a backing material.

The adhesive should be one that does not adhere to the metal lead wires when the wires are pulled loose from the tape strips. Also, the adhesive should be capable of withstanding moderately high temperatures without deterioration. Silicone adhesives have proved to meet these requirements satisfactorily. A specific tape which has been found to be suitable is sold under the trademark and designation "Vernon Black Wizard #615" tape by Vernon Chemical and Manufacturing Co., Mount Vernon, N.Y.

After the wires are taped together, the taping and flattening machine 34 flatens the areas 48, 49 or 50 on each of the three wires in each wire group. These flattened areas are provided to facilitate the attachment of semiconductor wafers or "dice" and electrode wires to the lead wires 32, to prevent the wires from turning in the molded transistor bodies, and for other purposes to be described below.

Next, the tape structure composed of flattened and taped-together lead-wires is wound upon a storage reel 52. When the reel is full, or when tape bearing a pre-determined number of lead-wires is wound on the reel, the tape is cut, thus leaving a discrete length of tape on the reel. Then the reel 52 is removed from the machine and is either transported directly to one of a plurality of die-attach machines 54, or is stored for future use.

When reel 52 is placed in a die-attach machine 54, the tape is unwound from the reel and each of a pair of semiconductor wafers or "dice" 56 is attached to one of the flattened porions 49 of the central wire of each group of three wires. The dashed arrow 58 illustrates the finished product of each die-attachc machine 54. Each die 56 preferably is a wafer of silicon or other semiconductor material treated by conventional techniques so as to form a conventional double-diffused transistor wafer. The bottom surface of each wafer forms its collector electrode and is secured in ohmic contact with a flattened portion 49 of the central lead wire by gold-silicon alloying techniques. The wafer 56 has ohmic contacts formed on its upper surface prior to its attachment to the flattened portion 49.

The die-attached tape product of machine 54 is wound on a storage reel 60 and either is set aside for storage until needed or is delivered immediately to one of a plurality of electrode lead-wire bonding machines 62.

Each bonding machine 62 produces the taped semiconductor product illustrated by dashed arrow 64. Extremely thin gold wires 66 are connected, by standard thermal-compression bonding techniques, between either the emitter of base ohmic conact of the semiconductor wafer 56 and the flattened portion 40 or 50 of one of the outside wires in each three-wire group, thus forming ohmic electrode connections to the lead-wires of the semiconductor device. The product of each bonding machine 62 is stored on a reel 68 which either is stored or is transported immediately to a cleaning machine 70.

Cleaning machine 70 spray-cleans and dries the transistors and, if desired, coats them with an anti-contaminant coating. The strip of cleaned transistor structures is stored on a reel 72 which either is stored or delivered immediately to one of a plurality of molding machines 74.

In each molding machine 74 a plastic body 76 is molded so as to encapsulate each of the two semiconductor structures on each group of three lead wires. In this manner, two separate transistors 30 are formed in each group of three wires. The "runners" 78 of plastic molding material remaining from the molding process then are removed from the transistors, and the sections of lead wire between the transistor bodies 76 in each group of three wires are removed so as to form two strips of finished transistors such as those shown in the lower right-hand corner of FIG. 1. These transistors then can be tested conveniently while still taped together, and then can be shipped to the customer in the same condition. Thus, the tape structure provide a flexible belt for conveying semiconductor parts between assembly stations, for positioning the parts at the station, for convenient storage of the parts when storage is desired, and packaging of the devices when completed.

The molded transistors 30 which are produced by the method and system of the present invention are well known in the prior art. They do not have an expensive metal "header" or casing like the usual transistor, and are intended primarily for use in commercial devices in which price and cost competition is strong. Molded transistors are used in such applications mainly because of their low cost; thus, it is extremely important that manufacturing costs of such transistors be minimized. The mass-producing method and system of the present invention meets this cost requirement admirably. It very substantially reduces the fabrication costs of such devices while still providing a high-quality product.

There are many other advantages of the above-described method and system. The use of the tape-belt structure from the beginning to the end of the fabrication process greatly simplifies and speeds the process. It minimizes the amount of transportation time needed between successive fabrication stations, and allows the skilled operator to concentrate almost exclusively on the production of devices, thus greatly increasing each operator's output and reducing labor costs.

Furthermore, the production speed of each machine in the system of the present invention is almost totally independent of the speed of any other machine in the production line. This creates several other advantages. If one of the multiple machines in the system breaks down, the other machines will not be forced to shut down. Thus, only one worker is idled by the breakage of a machine in the system. The production of the machines preceding the broken machine can be stored until the broken machine is repaired and resumes production.

Another major advantage is that the total number of production machines required by the system is minimized. For example, in FIG. 1 there is shown only one taping and flattening machine being used with six die-attach machines, three lead wire bonding machines, one cleaning machine, and two molding machines. Thus, a separate taping and flattening machine is not needed for each die-attach machine because the taping machine is fast enough to supply all of the die-attach machines, and the reel storage system makes distribution to the die-attach machines quick and easy. Since the electrode wire bonding process typically takes less time than the die-attach step, only three bonding machines are required, and the reel storage method again makes distribution a simple job. Similarly, only one cleaning machine and two molding machines are required to operate upon the product of the six die-attach machines. By thus minimizing the number of machines required, the cost of the fabrication system likewise is minimized. It should be understood, however that the specific relative numbers of machines shown in FIG. 1 are shown merely by way of example and are not necessarily representative of the relative numbers which actually will be used.

The use of the above-described tape and taping methods for producing molded transistors has many advantages. For example, in addition to having the foregoing advantages, the present invention makes it possible to produce two transistors simultaneously on one set of lead wires, thus providing a yield rate substantially greater than that of other systems. The low thermal and electrical conductivity of the tape speeds fabrication and simplifies testing of the devices, while the low rate of thermal expansion of the tape greatly facilitates the gang-molding of the transistors.

TAPING AND FLATTENING MACHINE

Figures 2, 3, 4:
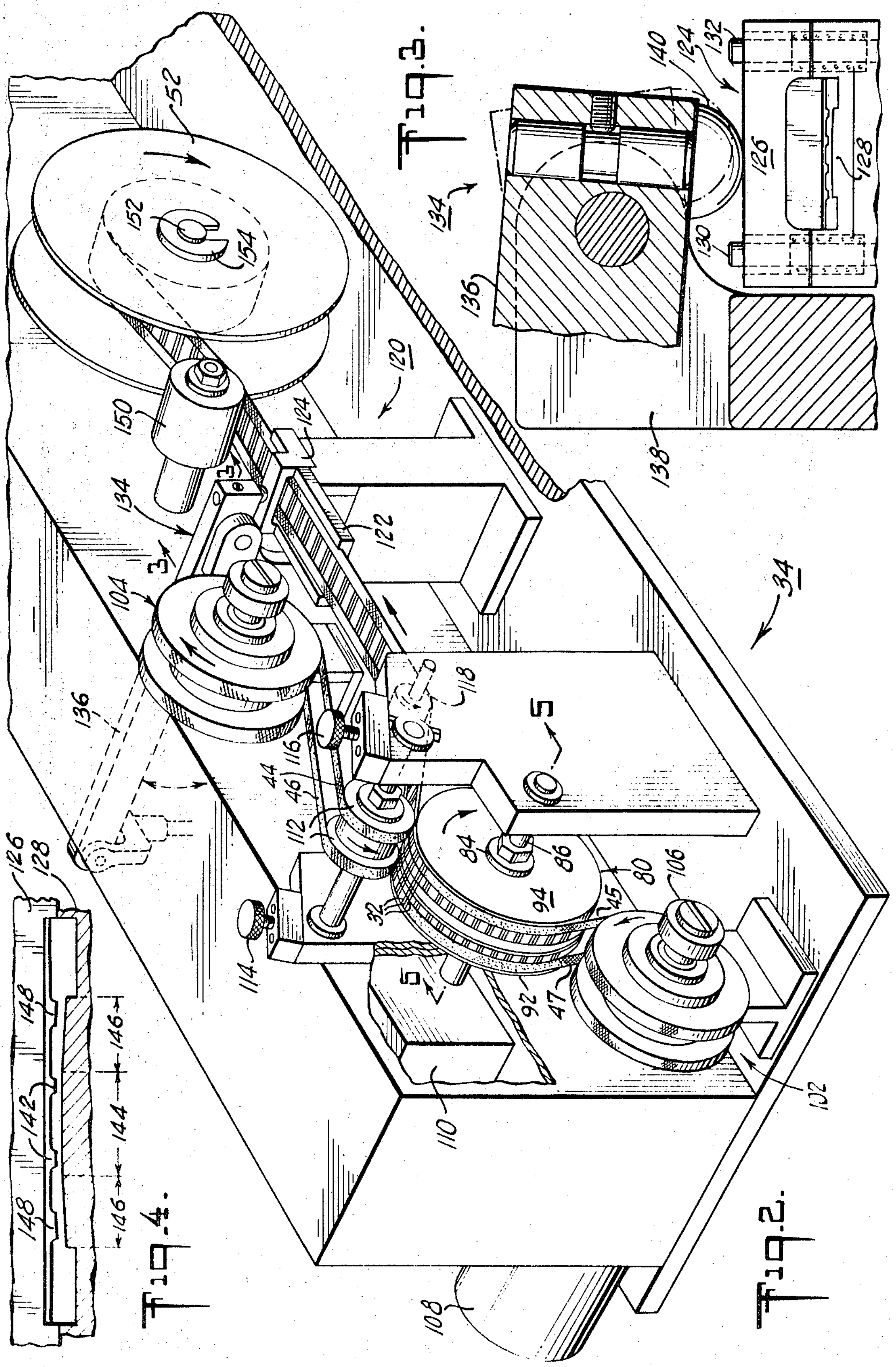
FIG. 2 is a perspective and partially broken-away view of the taping and flattening machine shown schematically in FIG. 1.
FIG. 3 is a partially broken-away cross-sectional view taken along line 3—3 of FIG. 2.
FIG. 4 is an enlarged view of a portion of the structure shown in FIG. 3.

The taping and flattening machine 34 is illustrated in detail in FIGS. 2 through 7. Referring to FIG. 2, the lead wires 32 to be taped together are aligned in slots in the circumferential surface of a feed and alignment wheel 80. The wires are aligned and taped together on wheel 80, and the wheel feeds the tape structure through the machine.

Referring particularly to FIG. 5, feed wheel 80 comprises a metallic main body 84 which is secured to a drive shaft 86. Main body 84 has circumferentially-extending recesses 88 and 90 along its edges and has annular plates 92 and 94 secured to its sides with their edges extending outwardly beyond the recessed surfaces 88 and 90 so as to form rectangular grooves at the edges of the wheels. A centrally-located circumferential groove is provided in the wheel, and a rectangular strip 96 of flexible permanently magnetized material is secured in the groove. The uppermost surface of magnetic strip 96 is in approximately the same plane as surfaces 88 and 90.

Two circumferential ridges 98 and 100 are located at the sides of the central recess in the circumferential surface of wheel structure 84. A plurality of wire-receiving slots is cut into the ridges 98 and 100. The slots 82 are arranged in groups of three, and adjacent groups are spaced apart on the wheel surface by an arc subtending an angle of about six degrees. As is best seen in FIG. 7, the edges of the entrance of each slot 82 are beveled so as to facilitate insertion of lead wires 32 into them. The distance between the opposed faces of side plates 92 and 94 is made slightly greater than the length of lead wires. Thus, the plates provide some alignment of the wire ends with respect to one another.

Referring again to FIG. 2, the four adhesive tape strips 44–47 are dispensed from a lower tape dispenser structure 102 and an upper tape dispenser structure 104. In each of the tape dispensers 102 and 104, two rolls of pressure-sensitive adhesive tape of the type described above are rotatably mounted on a support structure. A brake structure 106 provides resistance to the rotation of the tape rolls so as to maintain tension on the tape strips as they are unwound from the rolls.

Tape strips 45 and 47 are unwound and layed, respectively, into recess 88 and 90 in the feed wheel 80, with their adhesive surfaces facing outwardly. The distance between the bottoms of the wire-receiving slots 82 and the recessed surfaces 88 and 90 is pre-set so that the ends of the lead wires 32 will be close to or touching the adhesive surfaces of tape strips 45 and 47 when the wires rest on the bottoms of slots 82.

The operator of the taping machine places the lead wires 32 in the slots 82 at a position near the top of wheel 80. Each lead wire, which has a ferrous core, is held firmly in place and is pulled into contact with the adhesive surfaces of tapes 45 and 47 by the permanently-magnetized central strip 96. It should be understood that if desired, automatic means can be provided for feeding the wires sequentially into the slot 82. For example, the lead wires 32 can be stored in and automatically dispensed from a hopper by any of a number of known means.

After the wires 32 have been placed in the slots 82, the tape strips 44 and 46 are applied with their adhesive surfaces contacting the adjoining adhesive surfaces of strips 45 and 47. Strips 44 and 46 are applied by rubber feed rollers 112 which firmly press the strips 44 and 46 against the strips 45 and 47 to provide adhesion between the strips. Adjustment knobs 114 and 116 are provided to adjust the amount of pressure applied by rollers 112.

Feed wheel 80 is driven in a clockwise direction by an electrical drive motor 108 and an indexing drive system indicated schematically at 110 which drives wheel 80 through shaft 86 in successive steps, each of which rotates wheel 80 approximately six degrees. Each step can be initiated by the operator by means of a foot-pedal or other switch. The indexing drive system 110 may be any of a number of well-known arrangements for providing the stepped drive described.

After the tape-and lead-wire conveyor belt is formed at the taping station, it then is fed over an idler roller 118 and past a flattening station indicated generally at 120.

At the flattening station 120, the tape passes over a guide member 122 and then through a flattening die assembly 124.

Referring now to FIGS. 3 and 4 as well as FIG. 2, flattening die assembly 124 includes a punch member 126 and a striker plate 128. Punch member 126 is slidably mounted on pins 130 and 132 and is urged away from striker plate 128 by a pair of springs as illustrated in FIG. 3. A hammer assembly 134 includes a lever arm 136 which is pivoted near one end to a support structure 138. A hemispherical steel head 140 is secured to the end of lever 136. During each stepped movement of feed wheel 80 by the indexing drive system 110, the left end of lever arm 136 is raised so that the right end, to which the head 140 is attached, is depressed from the position shown in dashed outline to the position shown in solid outline in FIG. 3. This forces the punch member 126 against the striker plate 128 and forms the flattened areas 48–50 (see FIG. 1) on the wires in one of the groups of wires. This flattening process is repeated for every indexing drive step, thus flattening one group of wires per stop.

Referring now to FIG. 4, which is an enlarged cross-sectional view of the opposed surfaces of the punch 126 and striker plate 128, the punch 126 has a pair of flat-bottom ridges 142. The spacing between these ridges is made equal to the spacing desired between the flattened area on each lead wire 32. Striker plate 128 has a substantially flat portion which is indicated by dimension 144 in FIG. 4. When the punch 126 is pressed downwardly under the pressure of hammer head 140, the ridges 142 form the flattened areas on the wires. However, but for the additional features of the novel die assembly 124, the ends of the lead wires would bend upwardly under the flattening pressure, thus making the later assembly steps extremely difficult.

The latter problem is solved by giving the end portions 146 of striker plate 128 a downwardly-sloping surface and by providing two downwardly-extending ridges 148 on punch 126 opposite regions 146 of the striker plate. The lower surfaces of ridges 148 extend below the lower surfaces of ribs 142 and have an inclination generally the same as that of the inclined surfaces 146. These ridges tend to bend the lead wires backwardly to offset the upward-bending tendency described above and keep the wires straight.

It should be noted that the die assembly 124 provides a flattened surface which is near one side of each wire 32 (see FIG. 12). This facilitates alignment of the wires in subsequent process steps, as will be described in greater detail below.

After the wires have been flattened, the tape passes over an idler roller 150 and is wound upon the storage reel 52. Reel 52 is driven by the indexing drive system 110, but is driven through a conventional friction "slip" coupling which prevents damage to the tape due to change in diameter of the roll of tape being wound upon the reel 52. Reel 52 is mounted and secured in place on a shaft 152 by means of a slotted washer 154 which fits into a circumferential groove in the end of shaft 152 to hold reel 52 in place. Washer 154 easily is removed to permit the removal of a completed roll of tape. When reel 52 is full, the tape is cut, the full reel is removed, and an empty reel is placed on shaft 152. The free end of the tape is attached to the empty reel and the taping and flattening process is resumed.

Whenever the tape rolls are exhausted, new rolls easily may be added to the dispensers 102 and 104. In starting the new tape through the machine, one or more pieces of tape may be used as a "leader"; that is, it may be attached to the end of the new tape to pull the new tape through the machine and wind it on rool 52. In fact, such a leader may be attached to the end of every length of tape stored on a roll 52 so as to facilitate its feeding through successive machines in the fabrication system.

The taping and flattening machine 34 operates very rapidly and is ideally suited to the mass-fabrication of high-quality semiconductor devices at a low cost. It is compact and easy to operate, and easily can supply the requirements of several die-attach and bonding machines.

DIE-ATTACH MACHINE

Figures 8, 9, 10:
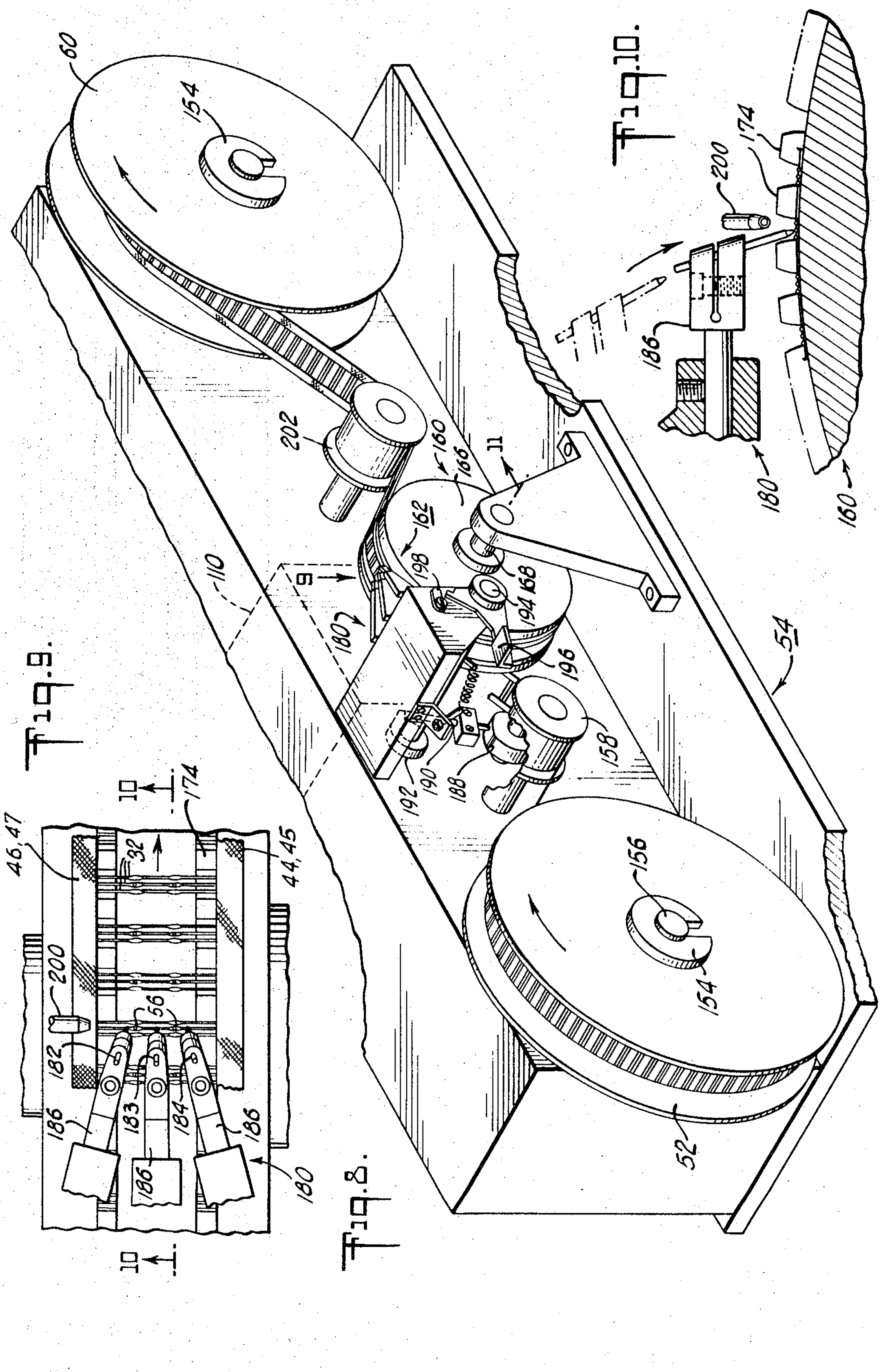
FIG. 8 is a partially broken-away perspective view of one of the die-attach machines shown schematically in FIG. 1.
FIG. 9 is a plan view of a portion of the apparatus shown in FIG. 8, looking in the direction of the arrow 9.
FIG. 10 is a partially schematic and partially cross-sectional view taken along line 10—10 of FIG. 9.

Referring now to FIG. 8, each die-attach has a spindle 156 upon which a full reel 52 of tape is mounted. The tape is unwound from reel 52, passes over an idler roller 158, and onto a driven feed and alignment wheel 160. At the top of wheel 160 is located a die-attach station 162 at which two semiconductor dice 56 are attached to the central wire of each group of three lead wires 32.

Referring now to FIGS. 11 and 12, feed wheel 160 includes a pair of discs 164 and 166 each of which is secured to a drive shaft 168. Each of discs 164 and 166 has an annular cut-out portion which forms a circumferential recess in the composite wheel 160 formed when discs 164 and 166 are secured together as shown in FIG. 11. An annular ring 170 is secured in this recess. The ring 170 and discs 164 and 166 are secured together by a plurality of pins 172 extending through holes in those three elements. Discs 164 and 166 are formed of a hard plastic material such as phenolic resin, and the annular ring 170 is formed of a heat-resistant material which is relatively non-conductive both to heat and electricity. Preferably, the latter material is that sold under the rademark "Mycalex."

Referring to FIGS. 10 and 12, a plurality of teeth 174 extend outwardly from the circumferential surface of wheel 160 at the sides of the annular ring 170. The distance between adjacent teeth at their bases is approximately equal to the width of a group of three lead-wires on the tape.

As is best seen in FIG. 12, three rectangular slots 176 are cut into the surface of annular ring 170 in the space between the bases of every pair of adjacent teeth 174. The width 178 of each groove 176 is just slightly greater than the diameter of each lead wire 32. Thus, when each wire of a set of three lead-wires is pressed into a slot 176, the outwardly-flared portions of the wire formed in the wire flattening process come to rest on the upper edges of the grooves 176. This axially aligns the wires so that the flattened areas 48–50 are uniformly horizontal. This makes the die-attach process easier and faster, and makes it possible to use automatically-positioned welding electrodes in the die-attach process, as will be described below.

Referring again to FIG. 8, feed wheel 160 is driven through shaft 168 by means of an indexing drive system 110 virtually identical to that used to drive the feed wheel 80 of the taping machine 34. This drive system rotates wheel 160 in steps each of which is of a length sufficient to bring the next group of three wires to the die-attach station 162 on the wheel 160.

As is shown in FIGS. 9 and 10, an electrode assembly 180 is provided which includes three electrodes 182, 183 and 184, each of which is mounted in a support structure 186. Each of the electrodes 182–184 is spaced from the other electrodes so that when the assembly 80 is lowered to the position shown in solid lines in FIG. 10 each electrode contacts the central wire of a group of three lead wires at a position which is closely adjacent to the two flattened portions on the central wire.

With the electrodes lowered into position, the operator uses a microscope (not shown) in positioning a die 56 on one of the flattened portions of the central wire, and then steps on a switch which sends a surge of electrical current between one of the outer electrodes 182 or 184 and the central electrode 183, thus heating the flattened area under the die and forming a silicon-gold alloy bond between the die and its flattened area. Then the other die is positioned on the other flattened area, another switch is actuated, current flows between the other electrode 182 or 184 and central electrode 183, thus bonding the other die to the other flattened area on the central wire. This separate heating of each die has the advantage that the total heating time for each die is minimized, thus minimizing the adverse effects usually encountered from excessive die heating. The operator then actuates another switch to move the feed wheel 160 and the tape ahead one step.

The closing of the latter switch starts the automatic shift equipment of die-attach machine 54. First, this equipment lifts electrode assembly 160 to the position shown in dashed lines in FIG. 10 just before the wheel 160 begins to move, and then the wheel is rotated forward one step. When the wheel has come to rest at its new position, the electrode assembly 180 automatically is lowered into the position shown in solid lines in FIG. 10. This cycle is repeated for every group of three wires on the tape.

The electrode assembly 180 is lifted during each indexing cycle by means of a cam 188 (see FIG. 8) which is rotated through one revolution during which it pushes a push-rod 190 which rotates the shaft 194 upon which electrode assembly is mounted through a crank member 192. Alternatively, the electrode 180 may be lifted by means of a hand-operated lever 196 which can be locked in its raised position by means of a latch 198 so as to hold the electrodes in the raised position whenever desired, such as during the threading of a new tape through the machine.

Preferably, water is supplied through cooling passages in the electrode support structure to keep the electrodes from overheating. A continuous stream of pure nitrogen gas is directed over the heated wires and electrodes so as to minimize oxidation and contamination during the heating process.

The tape passes from feed wheel 160 over an idler roller 202 and onto the take-up reel 60. Reel 60 is driven in the same manner as is reel 52 in the taping machine 34. A brake (not shown) is coupled to the supply reel 52 so as to provide resistance to its rotation and maintain tension on the tape.

The die-attach machine 54 greatly increases the speed and efficiency of the operator. It automaticaly moves the lead-wires into position and properly positions the heating electrodes with a minimum of effort on the part of the operator. This frees the operator to concentrate on the delicate job of positioning the dice, thus greatly speeding the di-attach operation and increasing the operator's productivity. Since two dice are attached in each die-attach operation, the productivity of the operation is further increased. The speed of the welding step is increased by the use of the non-conductive annular support 170 for the central portions of the lead-wires. Not only is this material unaffected by the high temperatures attained in that area, but it does not conduct any substantial amount of heat away from the wires, thus allowing them to heat more rapidly. What is more, the flared edges of the flattened area on the wires rest on the upper edges of slots 176, thus preventing the lead-wires from touching the bottoms of the slots and further minimizing heat loss to the support 170. The wire-receiving slots 176 accurately align the lead-wires at the time of welding and lower the welding surfaces of the wire with respect to the support 170 to minimize the area in which dropped dice can be lost, thus facilitating their retrieval. The downward pressure of the electrode tips holds the central wire steady so as to facilitate accurate dice location.

ELECTRODE-WIRE BONDING MACHINE

Figures 13, 16:
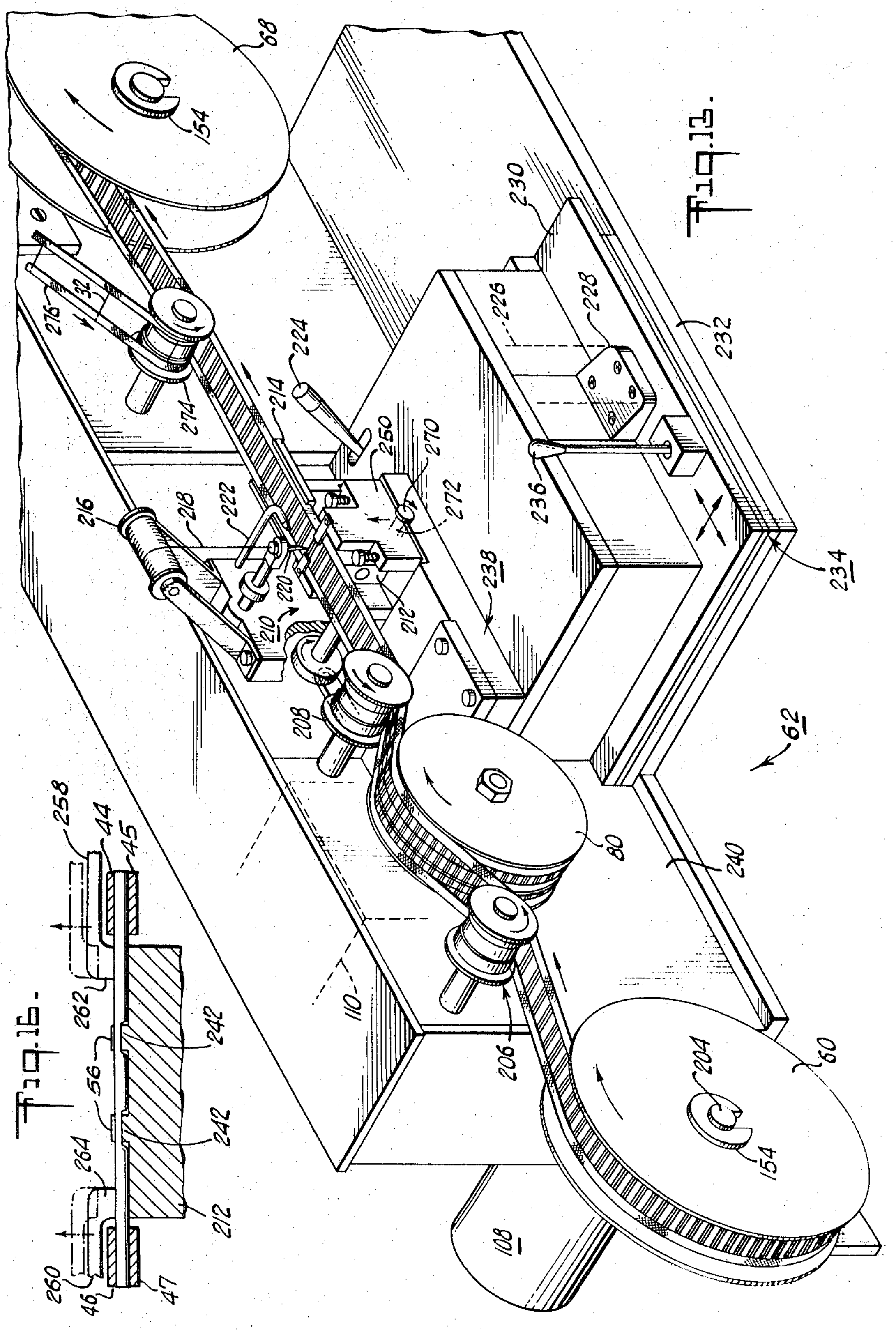
FIG. 13 is a perspective and partially broken-away view of one of the lead-wire bonding machines shown in FIG. 1.
FIG. 16 is a partially cross-sectional and partially schematic enlarged view of a portion structure shown in FIG. 15.

Referring now to FIG. 13, the reel 60 of taped components produced by the die-attach machine 54 is mounted on a spindle 204 in a bonding machine 62. The tape then is unwound from reel 60 and passes over an idler wheel shown in FIG. 2, and then over another idler roller 206, over a feed wheel 80 identical to the feed wheel shown in FIG. 2, and then over another idler roller 208. Feed wheel 80 is driven by a motor 108 and an indexing system 110 substantially identical to that used in the taping machine shown in FIG. 2. After passing over idler roller 208, the tape moves past a bonding station indicated generally at 210. The tape then passes over a bonding support block 212, over a guide 214, over another roller 274, and onto take-up reel 68.

A spool 216 of very thin gold electrode wire 218 is rotatably mounted above bonding station 210. Wire 218 is fed to a conventional thermal-compression bonding tip 220. A conventional gas pipe 222 is provided to supply a flame for cutting the gold wire. A control handle 224 is provided to raise and lower the bonding tip 220, and other conventional controls are provided to actuate the bonding mechanism. A microscope, indicated schematically by dashed lines 226 is mounted on a mounting plate 228 by means of a support which positions the microscope so that the work taking place at the bonding station 210 can be seen under magnification.

The microscope 226, the bonding tip 220, the spool 216 and the other equipment associated with the bonding tip all are secured to a movable support plate 230. Support plate 230 is movably mounted with respect to the base plate 232 of the bonding machine 62 by means of a universal movement arrangement indicated at 234 which allows the plate 230 to be moved in any direction desired merely by moving a lever 236. Lever 236 is connected to a ball which makes a ball-swivel connection between plate 232 and the support plate 230. Thus, the bonding tip 220 may with great precision be moved to and located at any desired position above any of the lead wires for making one of the several attachments to be made on each set of three lead wires. Advantageously, the microscope 226 moves with the tip 220 so that a continuous view of the area to be contacted by the welding tip is available.

A support structure indicated at 238 secures the bonding support block 212 and the guide 214 onto the front plate 240 of the bonding machine 62, thus holding the support block securely in place. It should be noted that the latter components are immovable and that the bonding tip, microscope, etc., are movable with respect to those components.

Figure 14:
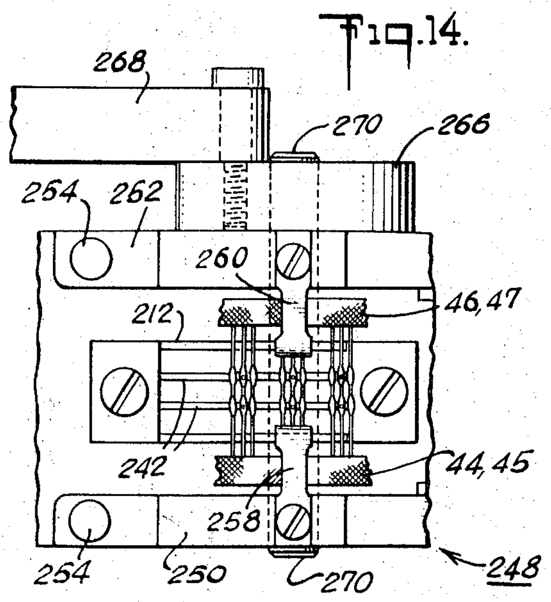
FIG. 14 is a plan view of a portion of the structure shown in FIG. 13.
Figure 15:
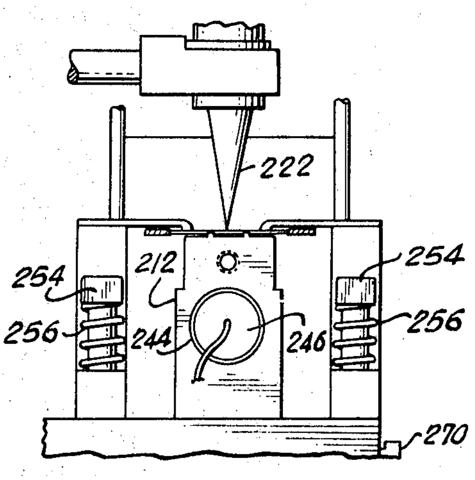
FIG. 15 is an elevation view of a portion of the structure shown in FIG. 13, including the structure shown in FIG. 14.

Referring now to FIGS. 14–16, bonding support block 212 has two longitudinal ribs 242 extending upwardly from its flat upper surface. As is best seen in FIG. 16, the ribs 242 are spaced from one another and have a height such that they extend into the recesses formed at the flattened portions of each wire opposite the surface upon which the dice 56 are secured.

As is best seen in FIG. 15, block 212 has a cylindrical recess 244 in which is mounted an electrical heating element 246. The heating element 246 heats the block 212 to a temperature of several hundred degrees centigrade, thus aiding and speeding the thermal-compression bonding process.

Referring now to FIG. 14, a clamping assembly 248 is provided to hold a group of three wires in place during the bonding process. Clamping assembly 248 includes two side-plates 250 and 252 which are slidably mounted on four vertical pins 254 with a spring 256 thrusting side-plates 250 and 252 downwardly. Two clamp arms 258 and 260 are secured, respectively, to the uppermost surfaces of sideplates 250 and 252. Referring especially to FIG. 16, clamp arms 258 and 260 each have a downwardly-bent end portion 262 or 264 which is positioned above one of the edges of the heating block 212. When clamp arms 258 and 260 are thrust downwardly under the force of springs 256 to the position shown in solid lines in FIG. 16, their bent ends 262 and 264 make contact with the three lead wires 32 in one group of lead-wires and force the wires against the surface of heating block 212. This not only holds the wires steady, but also tends to axially re-align the lead-wires so that the semiconductor wafers are substantially horizontal for accurate attachment of the electrode wires. In addition, this clamping action brings the wires into intimate contact with the heating block 212 so that there is a rapid transfer of heat from the block to the wires. It is to be noted that the wires are heated by contact with block 212 before being clamped, thus minimizing the heating time required after clamping and speeding the bonding process.

In operating the bonding machine 62, the operator presses a foot-operated switch to operate the indexing drive system 110 and move the tape forward one step. During the cycle which produces this movement, first the clamp arms 258 and 260 are lifted from contact with the lead wires, then the tape is moved forward, and then the clamp arms are lowered. This movement of the clamp arms is obtained by rotating a shaft 270 through an angle of 90° and back again. Shaft 270 has a flattened portion 272 (see FIG. 13) fitted under the lower edges of side-plates 250 and 252. The rotation of shaft 270 is accomplished by means of a wheel 266 (see FIG. 14) which is attached to shaft 270 and is driven by an excentrically-mounted link 268. Rotation of shaft 270 raises and the lower plates 250 and 252, thus raising and lowering clamping arms 258 and 260.

With the lead-wires clamped in place, the operator actuates the thermal-compression bonding tip 220 and associated equipment in a conventional manner to bond electrode lead-wires 66 (see FIG. 1) to the semiconductor dice and the flattened areas on adjacent wires in each group of three wires.

If desired, a spacer tape 276 may be added to the tape before it is wound on take-up reel 68. The purpose of the spacer 276 is to separate adjacent layers of the component-bearing tape so as to prevent damage to the partially-completed components when the tape is wound on the reel 68. It should be understood, however, that in most instances it has been found that the spacer 276 is not needed since the thickness of the tape strips 44–47 provides enough separation between tape layers.

Advantageously, the spacer 276 comprises four tape strips like strips 44–47 with widely spaced lead wires holding the strips together. Spacer 276 may be stored and dispensed from a storage reel (not shown) and passes over roller 274 so as to join the component-bearing tape.

Like the other machines in the system of the present invention, the bonding machine 62 greatly increases the productivity of the operator and the bonding equipment. The bonding machine makes it possible for the operator to work swiftly and yet produce a high-quality semiconductor product.

CLEANING MACHINE

Referring now to FIGS. 17–20, the tape bearing partially-assembled semiconductor components is unwound from reel 68 and fed into the cleaning machine 70 (FIG. 17) over an idler roller 278. If the spacer 276 is used, it is separated from the tape by passing it over a separate idler roller 280 and into a tube 282 which protects it while it passes through the cleaning machine 70.

Figures 17, 18, 19:
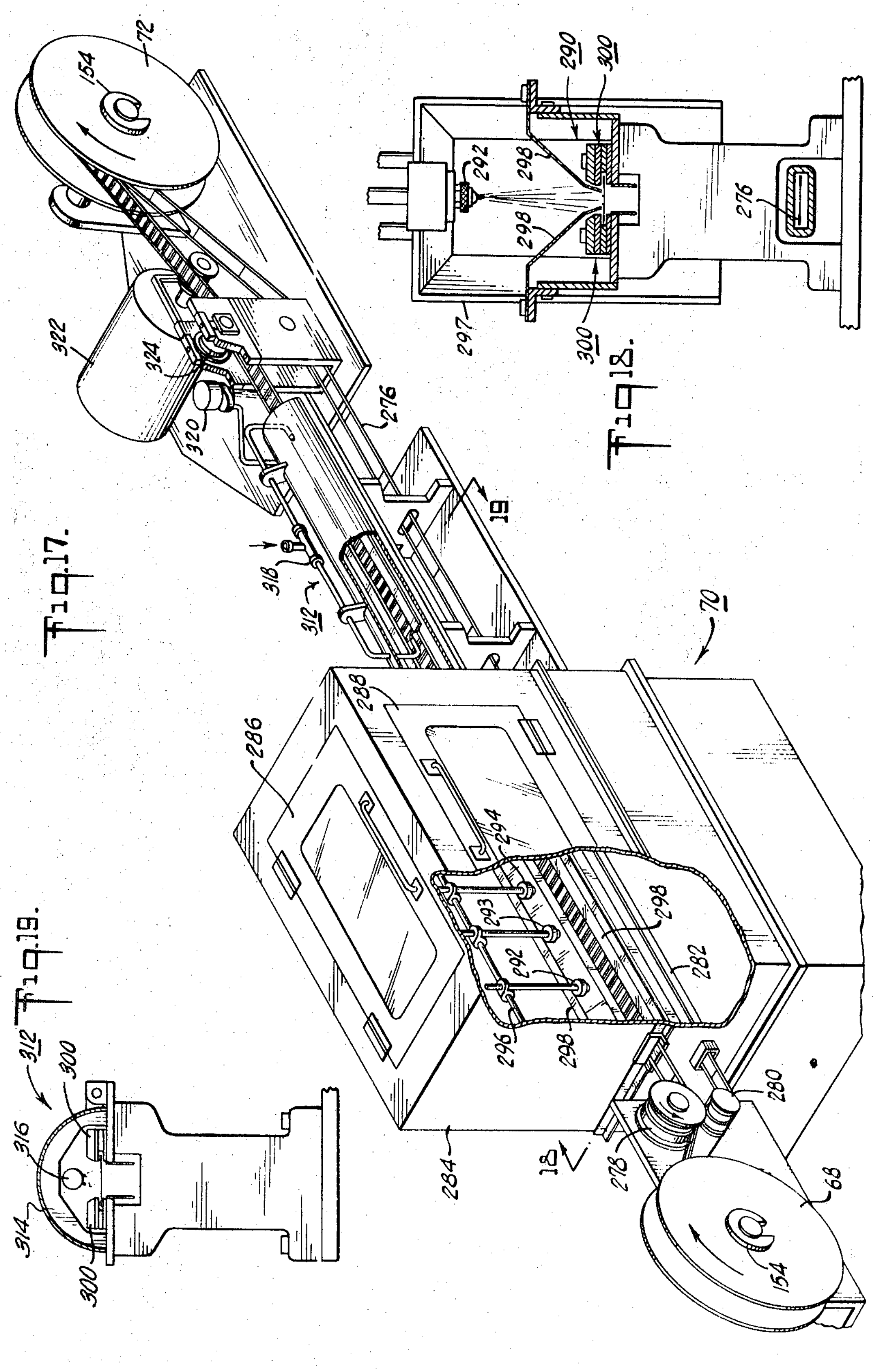
FIG. 17 is a partially broken-away perspective view of the cleaning machine shown in FIG. 1.
FIG. 18 is a cross-sectional, partially broken-away view taken along section line 18 of FIG. 17.
FIG. 19 is a cross-sectional and partially broken-away view taken along section line 19, of FIG. 17.

As is shown in FIG. 17, the tape passes first into a spray cleaning housing 284 with an upper glass-panelled door 286 and a similar side door 288. The tape passes through a shielding assembly indicated at 290 (FIG. 18), and beneath three spray heads 292, 293, and 294 which are movably suspended from a rod 296. Hoses (not shown) supply cleaning liquids to the spray nozzles. For example, acetone is supplied to the first nozzle 292, alcohol to the second nozzle 293, and de-ionized water is supplied to the third nozzle 294. A stream of pure nitrogen is blown over the semiconductor devices as they leave the housing 284 so as to blow off the major portion of the liquid clinging to the components as they leave the housing 284.

Figure 20:
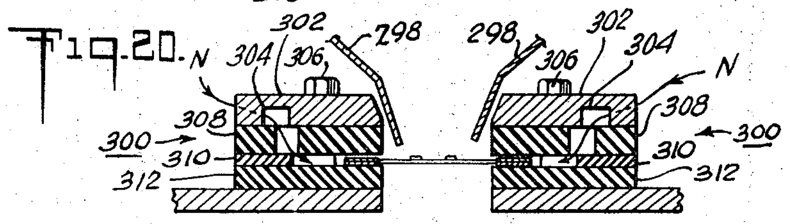
FIG. 20 is an enlarged view of a portion of the structure illustrated in FIG. 18.

Referring now to FIGS. 18 and 20, the shielding assembly 290 is provided to protect the tape strips 44–47 from contact with the liquids being sprayed on the semiconductor components. The reason for providing this protection is that some of the components of the adhesives on the tape strips 44–47 might be deleteriously affected if they came into contact with the solvents and water being sprayed on the semiconductor components. A pair of shields 298 is provided to deflect the spray away from the tapes. In addition, two unique tape-guide structures 300 are provided for giving substantially complete protection.

Referring now to FIG. 20, each tape-guide structure 300 includes a stainless steel top plate 302 with a longitudinally-extending groove 304. Plate 302 is secured by means of a screw 306 in a sandwich structure including three plates 308, 310 and 312 each of which is made of a low-friction, chemically and thermally stable material such as that sold under the trademark "Teflon." The uppermost plate has a series of holes equally spaced along its length, each communicating with the groove 304. The intermediate plate 304 has a plurality of similarly spaced slots each of which extends to the innermost edge of plate 304 and communicates with a corresponding hole in member 308. The intermediate plate 310 is narrower than the bottom and top plates 312 and 308 so as to provide a lateral recess into which the tape can be fitted. Dry nitrogen gas is fed into the groove 304 and passes through the holes in upper plate 308 and through the slots in plate 310 (see arrows "N" in FIG. 20) to provide a plurality of equally-spaced streams of nitrogen gas blowing over the tape strips toward the semiconductor components. These nitrogen streams tend to blow cleaning liquid droplets away from the tapes. Since the plates 308, 310 and 312 are made of "Teflon," the tape strips slide smoothly and effortlessly through the guide assembly.

After the tape leaves the cleaning housing 284, it enters a drying enclosure 312 (FIGS. 17 and 19). Drying enclosure 312 has a hinged cover 314 and a longitudinally extending tube 316 which is supplied with hot nitrogen gas from a pipe 318. The tape strips are guided through the drying enclosure 312 by means of tape guides 300 identical to those shown in FIG. 20. The hot nitrogen is distributed from tube 316 in jets which issue from a plurality of longitudinally-spaced holes. The jets play over the semiconductor components and thoroughly dry them. Cool nitrogen gas is supplied to the tape-guides 300 so as to prevent the tape strips from being overheated.

As the tape leaves the drying enclosure 312, it may, if desired, be sprayed with a protective coating by a spray-coating mechanism 320. A typical spray coating compound which may be used is "Dow-Corning #643" semiconductor coating resin. Advantageously, the sprayer 320 is controlled by a micro-switch-operated valve (not shown) so that it is operative only when a group of three wires passes beneath its spray tip. The micro-switch has a roller which contacts the tape strips and closes the switch to actuate the valve when the roller contacts the ends of the lead-wires between the tape layers. This results in a considerable saving in coating material.

The tape is driven through the cleaning machine 70 by means of a motor 322 which drives a pair of rubber rollers 324. The tape and the spacer 226 are re-united and wound upon the take-up reel 72 which is driven in the same manner as the take-up reels of the other machines in the fabrication system.

The cleaning machine cleans and thoroughly dries the semiconductor devices rapidly, and yet provides complete protection for the adhesive tape. The cleaning machine 70 operates so rapidly that it can clean the devices produced by several die-attached and bonding machines.

MOLDING MACHINE

The equipment used for molding the transistors 30 shown in FIG. 1 is, for the most part, well known. However, certain features of the molding process and the molds of the present invention are unique.

Figure 21:
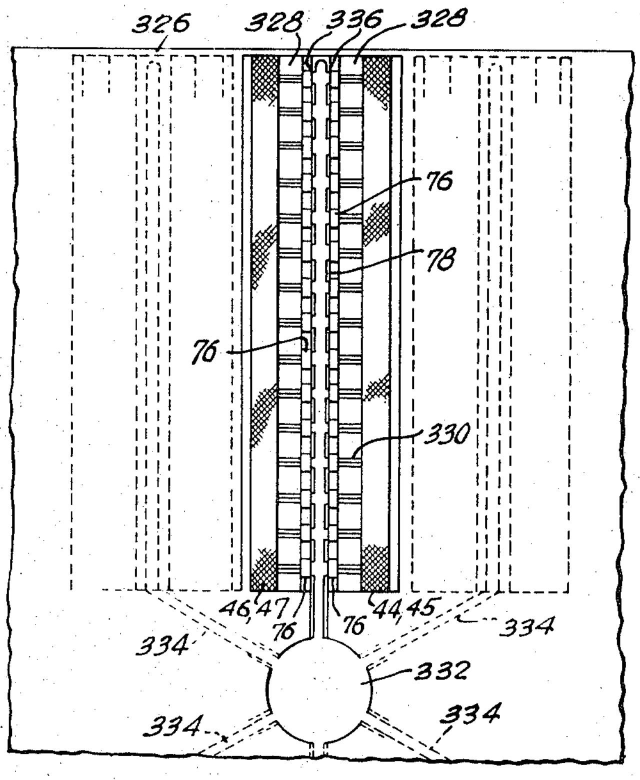
FIG. 21 is a plan view of a portion of a mold used in the molding machines illustrated in FIG. 1.

In the molding process, the tape is unwound from reel 72 and is cut into discrete lengths, for example, lengths of 15 groups (30 transistors). From one to six of such strips then are placed in one of a pair of molds such as the mold 326 illustrated in FIG. 21. Each mold 326 includes grooves into which the tapes 44–47 fit. In addition, ridges 328 are provided, each of which has fifteen sets of three grooves 330 into which the lead wires 32 fits relatively tightly. Appropriate grooves and depressions provide communication passageways and cavities for forming the plastic bodies 76 of the transistors.

With the two molds 326 held together under pressure, hot fluid plastic is supplied under pressure to the passageways from a central supply port 332 to form the plastic bodies 76 around each semiconductor wafer and electrode lead-wire of each semiconductor device. Each of the grooves 334 shown in dashed outline in FIG. 21 leads to an additional molding area identical to the molding area just described. As many molding areas as desired can be provided in each mold.

Advantageously, in one of the pair of molds a sharp ridge 336 is provided so that when the two molds are forced together under pressure, this sharp edge cuts part of the way through the lead-wires at the edge of each plastic body 76. When the molding process is finished, each tape length is removed from the mold and separated into two strips of individual transistors such as those shown in the lower right-hand portion of FIG. 1 merely by breaking the tape into two halves. The halves easily break apart at the positions where the wires have been cut partway through. This procedure automatically removes the central "runner" 78 which remains when the molding process is finished. The "runner" 78 clings to the lead-wire segments between the molded bodies and is broken away with those segments when the tape strip is broken in half.

The plastic materials used to form the plastic body 76 are well known. For example, a silicone resin such as "Dow-Corning #306" molding compound can be used. The compound typically is a powder which is heated to a liquid in the mold. It is forced into the mold cavities under high pressure and is cured in the mold at an elevated temperature for from 2½ to 3 minutes. The mold is maintained at a temperature of approximately 300 to 350 degrees Fahrenheit. When the transistors are removed from the molds, the plastic is further cured for an additional two hours at a temperature of 400 degrees Fahrenheit.

The transistors then are cooled, tested, packaged and shipped to the customer. If desired, the tape which is used to hold the components together throughout the fabrication process can be left on the transistors for convenient packaging and shipping.

The above-described molding process is highly advantageous; gang-molding is made practical and simple since the tape strips are easily inserted into the molds and since the low thermal expansion of the flexible fabric tape allows the wires 32 to fit tightly into slots 330 without distortion due to differences in thermal expansion between the mold metal and the tape material.

The above description of the invention is intended to be illustrative and not limiting. Various changes or modifications in the embodiment described may occur to those skilled in the art and these can be made without departing from the spirit or scope of the invention as set forth in the claims.

We claim:

1. Apparatus for mass-producing transistors, said apparatus comprising, in combination, at least one taping machine for forming discrete lengths of tape bearing sequentially-positioned conductive mounting means for transistors, said taping machine including means for rolling each of said lengths of tape onto a separate reel, a plurality of die-attach machines for securing a transistor die on each of said mounting means, each of said die-attach machines including means for unwinding tape from one of said reels, feeding said tape past a die-attach station, and winding said tape on another reel. a plurality of bonding machines for bonding electrode wires to each of said dice and its mounting means, each of said bonding machines including means for unwinding said tape from said other reel, feeding it past a bonding station, and rewinding said tape on a third reel, at least one washing machine for cleaning the assembled components on said tape, and at least one machine for encapsulating said components.

2. Apparatus for taping together and flattening transistor lead-wires, said apparatus comprising, in combination, a wire-placement wheel having a plurality of equally-spaced groups of three axial grooves in its circumferential surface, first and second means for storing and dispensing pressue-sensitive adhesive tapes from first and second pairs of laterally-spaced tape rolls, said first dispensing means being positioned so as to dispense its tapes onto laterally-spaced areas of said wheel surface with the adhesive-bearing surfaces of said tapes facing outwardly, said second dispensing means being positioned so as to dispense each of its tapes onto one of the tapes dispensed onto said wheel from said first dispensing means, with the adhesive-bearing surfaces of said tape in contact with one another, means for pressing said adhesive surfaces together and thereby securing both ends of lead wires in said grooves in an adhesive tape sandwich construction, means for flattening each of said tape-mounted lead wires at two longitudinally-spaced positions, a reel for storing lengths of said tape-mounted lead-wire structure, means for driving said wheel and said reel in steps, each of said steps being of length sufficient to move said tape-mounted lead-wire structure the approximate distance between adjacent groups of three wires in said tape structure, and means for actuating said flattening means during each of said steps.

3. In apparatus for fabricating semiconductor devices by assembling semiconductor device components on each of a plurality of groups of lead-wires secured in spaced-apart relation on at least one strip of flexible tape, an alignment wheel for aligning said lead wires with respect to one another, said wheel having axially-extending grooves in its circumferential surface, the size of each of said grooves being sufficient to receive one of said lead-wires, the spacing between said grooves being in accordance with the desired spacing between said lead-wires.

4. In apparatus for fabricating semiconductor devices by assembling semiconductor device components on strips of flexible tape, an alignment wheel for aligning said components with respect to one another on said tape, said alignment wheel having a plurality of circumferentially-distributed cavities for holding said components, the spacing between said cavities being in accordance with the desired spacing between successive ones of said components on said tape.

5. Apparatus as in claim 4 in which said alignment wheel has first and second flat-bottomed circumferential depressions, each located at one axial end of a circumferential surface, and another circumferential depression between said first and second depressions, said other depression having a hoop-shaped permanent magnetic member secured in it, the outermost surface of said magnetic member bieng substantially flat and being positioned so as to support components in said cavities.

6. Apparatus as in claim 3 in which said wheel is made of electrically non-conducting material, which has spacer teeth, each protruding from said surface at a position such that it extends into the space between adjacent ones of said groups of wires, said grooves each being dimensioned so that the main body of each of said wires fits into each of said grooves, but that a flattened portion of said wire does not fit and rests on the edges of said grooves.

7. In apparatus for fabricating semiconductor devices by assembling semiconductor device components on each of a plurality of groups of lead-wires secured in spaced-apart relation on at least one strip of flexible tape, means for flattening at least one portion of each of said wires, said flattening means including a punch structure having an outwardly-extending flat-bottomed rib and two ridges extending outwardly beyond said rib, one ridge on each side of said rib, a striker plate having a flat striker surface, the width of said flat striker surface being less than the separation between said ridges, and means for supporting said striker plate and said punch structure so as to be movable towards and away from one another with said flat striker surface being positioned to fit between said ridges when said rib is brought into contact with said striker surface.

8. Apparatus as in claim 7 including two of said ribs parallel to but spaced from one another, spring means for normally urging said striker plate away from said punch, and means for periodically applying a force driving said striker plate and punch towards one another.

References Cited

UNITED STATES PATENTS

| | | | |
|---|---|---|---|
| 2,962,058 | 11/1960 | Karnavas et al. | 29—591X |
| 3,073,007 | 1/1963 | Rubinstein et al. | 228—11X |
| 3,171,187 | 3/1965 | Ikeda et al. | 29—574 |
| 3,263,305 | 8/1966 | Butler et al. | 29—203X |
| 3,281,628 | 10/1966 | Bauer et al. | 29—588X |

THOMAS H. EAGER, Primary Examiner